(12) United States Patent
Fang

(10) Patent No.: US 6,878,963 B2
(45) Date of Patent: Apr. 12, 2005

(54) DEVICE FOR TESTING ELECTRICAL CHARACTERISTICS OF CHIPS

(75) Inventor: Jen-Kuang Fang, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 19 days.

(21) Appl. No.: 10/287,336

(22) Filed: Nov. 4, 2002

(65) Prior Publication Data

US 2003/0094963 A1 May 22, 2003

(51) Int. Cl.[7] .......................... H01L 23/58; H01L 23/48
(52) U.S. Cl. .......................... 257/48; 257/734; 257/736
(58) Field of Search .................................. 257/734, 736, 257/48, 737, 778; 324/754, 757, 758, 765

(56) References Cited

U.S. PATENT DOCUMENTS 5,597,737 A * 1/1997 Greer et al. .................. 438/17
6,249,044 B1 * 6/2001 Kao et al. .................... 257/678
6,251,501 B1 * 6/2001 Higdon et al. ............... 428/209
6,426,281 B1 * 7/2002 Lin et al. ..................... 438/612
6,518,161 B1 * 2/2003 Rajagopalan et al. ....... 438/612
6,596,618 B1 * 7/2003 Narayanan et al. .......... 438/612
6,639,314 B2 * 10/2003 Boettcher et al. ........... 257/736

* cited by examiner

Primary Examiner—Robert Pascal
Assistant Examiner—Scott B. Geyer
(74) Attorney, Agent, or Firm—Seyfarth Shaw LLP

(57) ABSTRACT

The present invention discloses a device for testing electrical characteristics of a chip, which is capable of verifying whether each chip can meet the requirement of the electrical specifications, and sort out the chips under the specifications. The invention utilizes a probe to contact the extension area of the under bump metallurgy to detect if the electrical characteristics of the chip can meet the requirement of the specifications. As the bumps on the chip do not actually contact the probe, the intact profile for the bumps on the chips can be assuredly kept so that the problem of voids existing in the melted bumps during reflow process can be avoided.

16 Claims, 6 Drawing Sheets

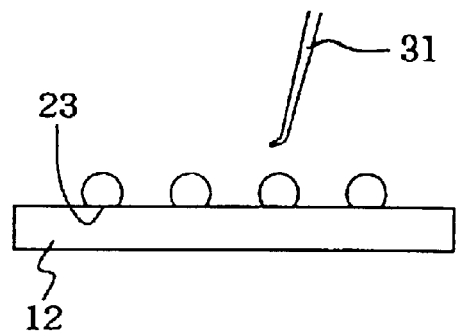
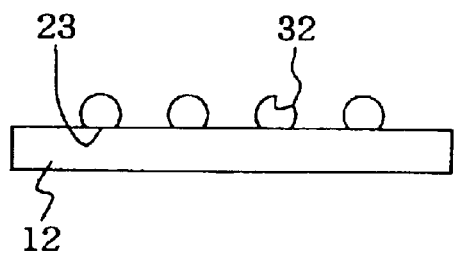
FIG. 3(a) (Prior Art)   FIG. 3(b) (Prior Art)
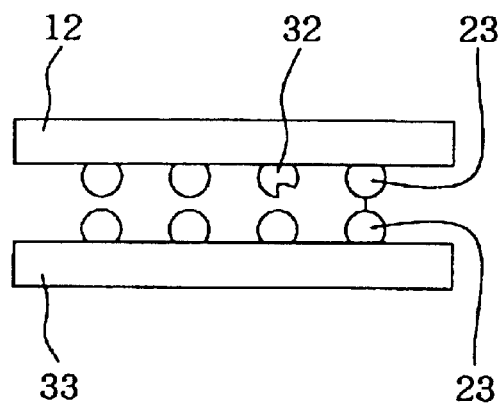
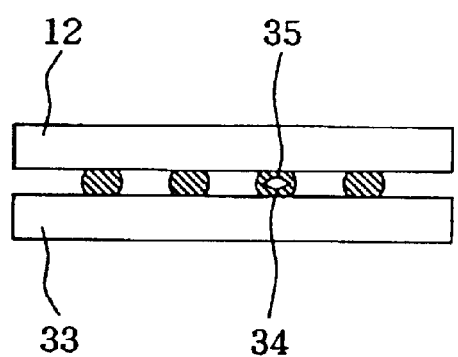
FIG. 3(c) (Prior Art)   FIG. 3(d) (Prior Art)

DEVICE FOR TESTING ELECTRICAL CHARACTERISTICS OF CHIPS

BACKGROUND OF THE INVENTION

1. Field of the Invention

The present invention relates to a device for testing semiconductor elements, especially to a device for testing electrical characteristics of a chip.

2. Description of the Related Art

As for the increasing requirement for the portability of consumer electronic products, the flip-chip technology definitely provides the best method to achieve the object of making electrical products lighter, thinner, shorter and smaller. For this technology, it is a very important issue about how to increase the stability and reliability of the electrical characteristics of the bumps. If the bumps have bad connections, the electrical performances and the lifetime of the consumer electronic products will be impacted.

After the completion of the front-end wafer manufacturing process and before the back-end package process, the electrical characteristics of each chip 12 have to be tested on the wafer 11 first, as shown in FIG. 1. If there are defects found in the electrical characteristics of the chip 12, they will be marked on the surface of the chip 12 and, after the wafer 11 is diced, the defected chip 12 will be rejected or employed in other downgrade applications.

Generally speaking, in flip-chip technology, there are many bumps 23 provided on the chip 12 to serve as the electrical connections of the chip 12 with the external circuit board or with the other chip, as shown in FIG. 2. There is an under bump metallurgy (UBM) 24 provided between the bump 23 and the bonding pad 21 of the chip 12, which typically includes three metal layers (for example, wetting layer 241, barrier layer 242 and adhesion layer 243) laminated above bonding pad 21 in sequence as shown in the table below:

|   |   | Name | | |
| --- | --- | --- | --- | --- |
| Type | Material | Adhesion layer 243 | Barrier layer 242 | Wetting layer 241 |
| Al bonding pad | Al | Ni—V | Cu | |
| Cu bonding pad | Ti | Ni—V | Cu | |
|  | Cr | Ni—V | Cu | |
| Thickness |  | Hundreds of A° | 0.5~1.0 μm | Hundreds of A° |
| Purpose |  | Firmly adhere to the protection layer and the bonding pad | Protect the circuit layer against penetration of the bump material | Weld with the bump material |

There is a protection layer 22 (or named passive layer) provided on the lateral of the interface between the UBM 24 and the bonding pad 21. The purpose of the UBM 24 described in the above table has an area that is slightly smaller than or approximately equal to the cross-sectional area of the bump 23.

When the electrical characteristics of the chip 12 are conventionally tested, a probe 31 is used to contact the bumps 23 of each chip 12 directly respectively, as shown in FIG. 3(a). The material of the bump 23 can be selected from gold or solder etc., and can be bumped by the electroplating, deposition or printing on the bonding pad 21 of the chip 12 so as to transmit the electrical signal with the substrate 33 or the other chips. The signal detected by the probe 31 is verified by a testing program of a testing machine (not shown).

However, the conventional test method often results in many problems, referring to FIGS. 3(a) to 3(d). During the testing process, the probe 31 downwards contacts and presses on the bump 23, such that a recess 32 is easily formed at the contact area of the bump 23, as shown in FIG. 3(b). Thereafter, while the chip 12 and the substrate 33 proceed with a reflow process, it is extremely liable to cause the welded bump 35 to have voids or bubbles 34, resulting in weak electrical connection or function failure. Even the chip 12 may pass the electrical testing criteria; it would prematurely fail in the succeeding operation caused by inferior reliability.

SUMMARY OF THE INVENTION

The major object of the present invention is to provide a reliable test device for the electrical characteristics of the bumps, to conduct the probe test, reduce the defects from bad welding, and increase the product reliability.

To achieve the above object, the invention discloses a device for testing electrical characteristics of a chip, which can be practically applied in the packaging process of the electronic components. First, using a specially designed photo mask in the wafer manufacturing process for conducting the processes, such as exposure, developing and etching etc., so as to extend the UBM area originally covered with the bump towards at least one lateral direction. The extension area of the UBM should accommodate the probe in test operation by touching each other. If electrical characteristics are not necessary for some specific bonding pads or bumps, the extension areas may be omitted from the initial steps of circuit design.

In order to ensure whether all the chips can meet the requirement of the electrical specifications and to sort out the chips under the specifications, the invention utilizes a probe to contact the extension area of UBM so as to detect if the electrical characteristics of the chip can meet the specifications. Because the bumps on the chip are not actually contacted the probe, the intact profile for the bumps on the chips can be assuredly kept so as to solve the problems in the prior art.

BRIEF DESCRIPTION OF THE DRAWINGS

The invention will be described according to the appended drawings in which:

FIGS. 3(a) to 3(d) show schematic diagrams of a conventional test method;

PREFERRED EMBODIMENT OF THE PRESENT INVENTION

Figure 1:
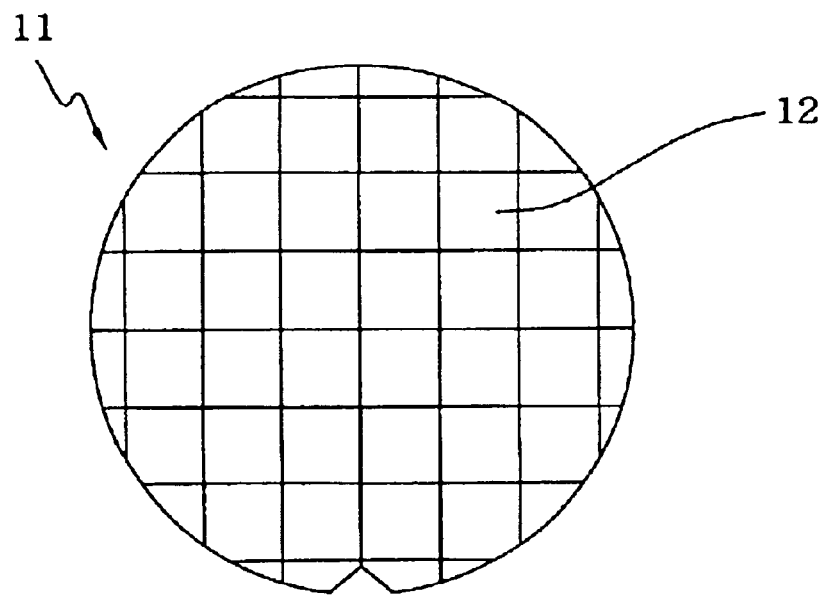
FIG. 1 is the schematic diagram of a conventional semiconductor wafer.
Figure 2:
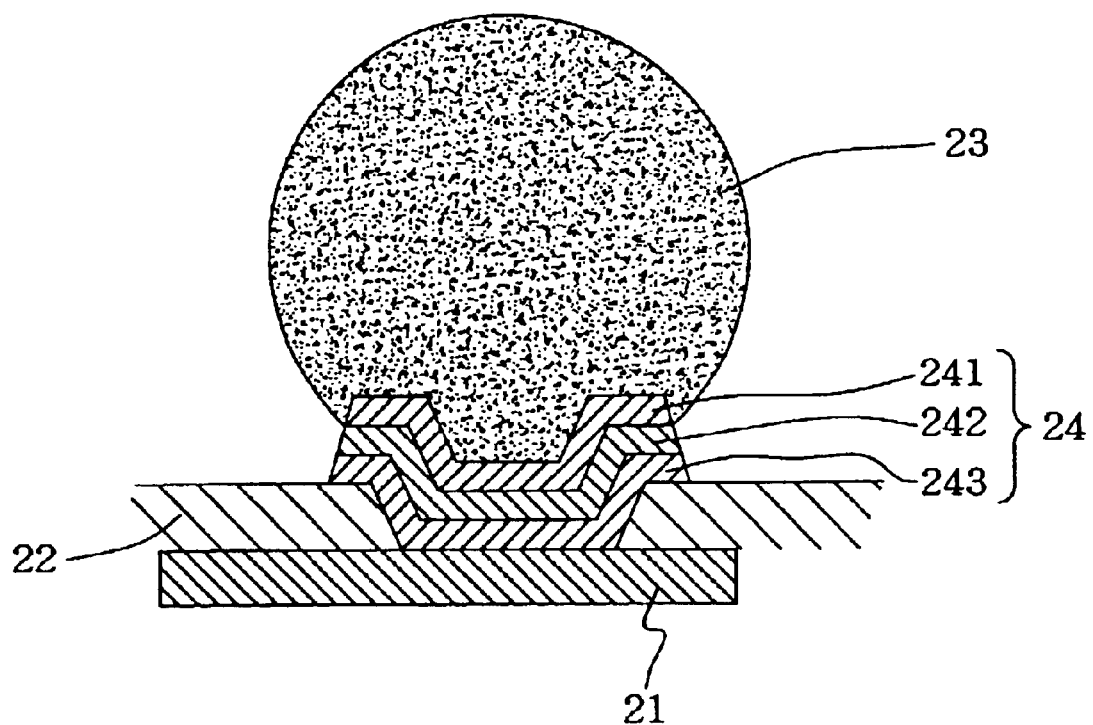
FIG. 2 is the structural schematic diagram of the bump bumped on the UBM in a conventional test method.
Figure 4:
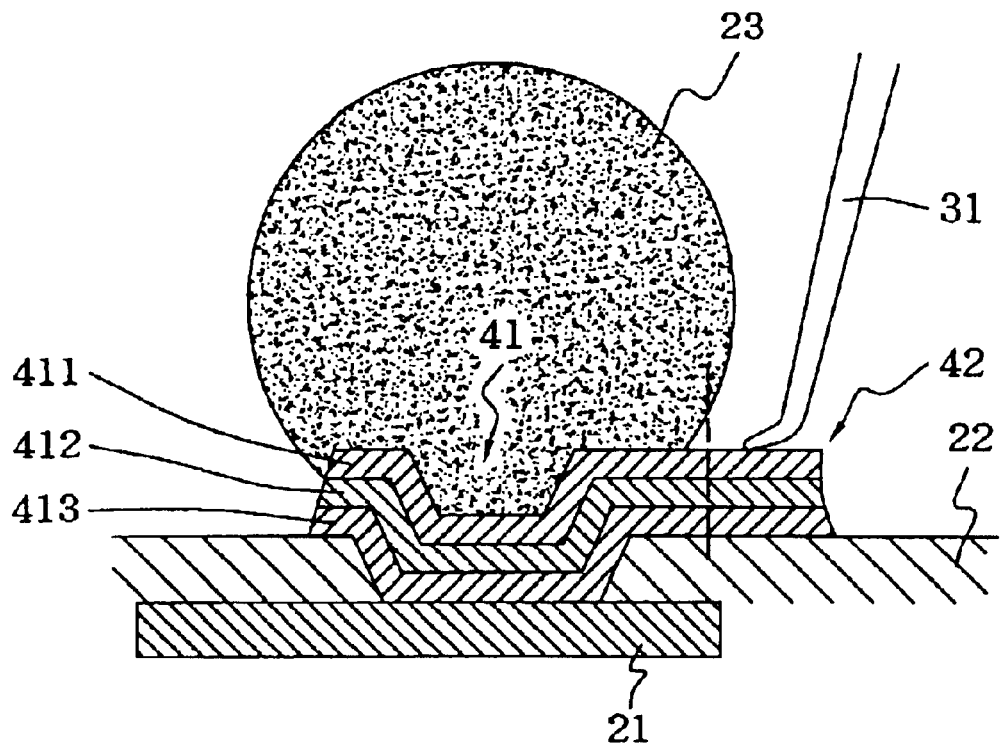
FIG. 4 is the schematic diagram of the bump bumped on the UBM according to the invention.

FIG. 4 is the schematic diagram of the bump bumped on the UBM according to the invention, wherein there is a UBM 41 provided between the bump 23 and the bonding pad 21, which includes an adhesion layer 413, a barrier layer 412 and a wetting layer 411. The UBM 41 is provided with an extension area 42, which laterally extends from the bottommost bump 23 and forms a step configuration. And the area of the extension area 42 is enough for the probe 31 to conduct the test operation, including sufficient contact area for the head of the probe 31 and tolerable area to ensure the probe 31 will not touch the bump 23 while traveling. Furthermore, the extension area 42 is at least formed from one side of the UBM 41, and may be at four sides, which depends on the test requirement. In other words, when the photo mask is being designed, it is considered that the extension area 42 covered with photoresist would not be removed during etching process. Because the extension area 42 and the bonding pad 21 are electrically connected in a junction, the probe 31 can contact the extension area 42 directly to achieve the same test object as in contact with the bump 23 directly. With the test device of the invention, the intact profile for the bump 23 on the bonding pad 21 can be assuredly kept. The final test result only needs to be properly marked (e.g. spotted on the corresponding chip with colored ink) or recorded with a mapping file. In this embodiment, the extension area 42 is formed from one side of the UBM 41, and the side wall of another side of the UBM 41 is covered by the lower portion of the bump 23.

Figure 5:
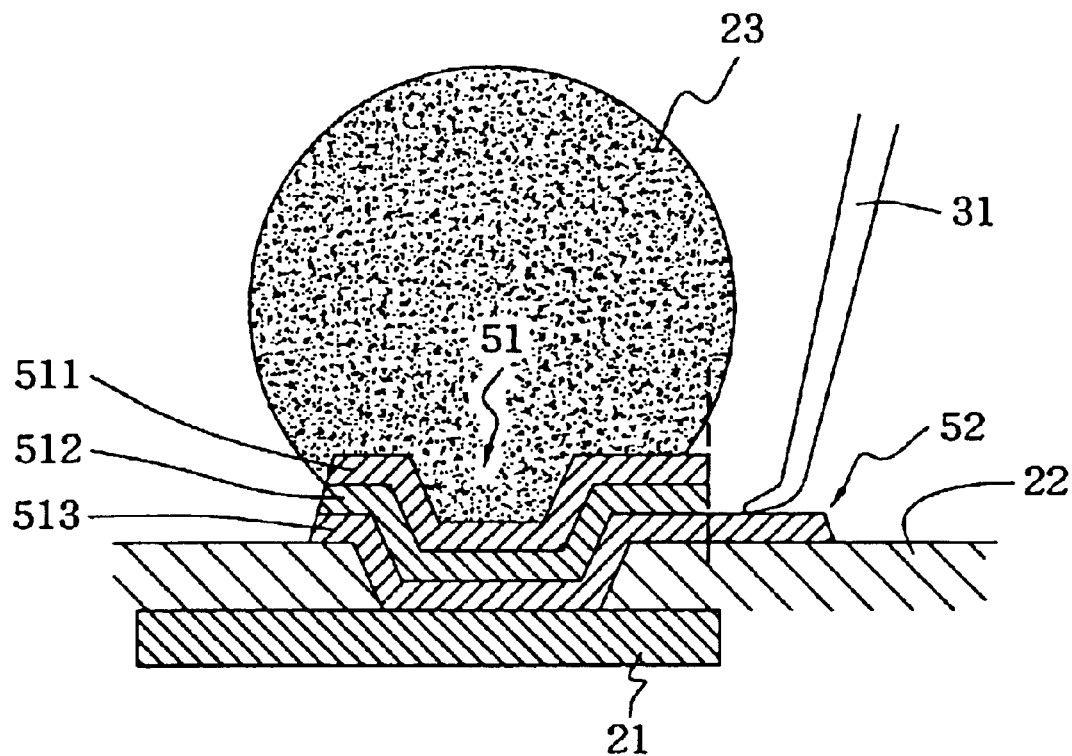
FIG. 5 is another schematic diagram of the bump bumped on the UBM according to the invention.

FIG. 5 is another schematic diagram of the bump bumped on the UBM according to the invention, wherein there is a UBM 51 provided between the bump 23 and the bonding pad 21, which includes an adhesion layer 513, a barrier layer 512 and a wetting layer 511. The difference from FIG. 4 is that only the adhesion layer 513 of the UBM 51 in FIG. 5 is provided with an extension area 52, and the material of the extension area 514 is the same as that of the adhesion layer 513. In other words, while the photo mask is being designed, it is considered that the photoresist used to cover the extension area 52 would not be removed during etching process. Because the extension area 52 and the bonding pad 21 are electrically connected in a junction, the probe 31 can contact the extension area 52 directly to achieve the same test object as in contact with the bump 23 directly. With the test device of the invention, the intact profile for the bump 23 on the bonding pad 21 can be assuredly kept. The final test result only needs to be properly marked (e.g. spotted on the corresponding chip with colored ink) or recorded with a mapping file. In this embodiment, only the adhesion layer 513 is provided with an extension area 514. It is to be noted that the adhesion layer 513 and the barrier layer 512 can also be provided with an extension area.

Figure 6A:
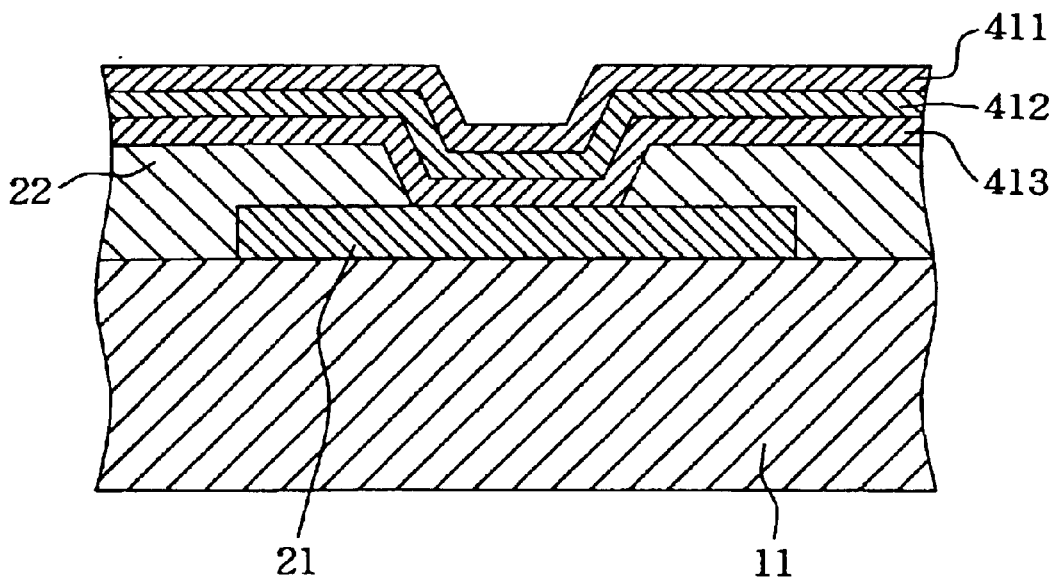
FIGS. 6(a) to 6(e) show structural schematic diagrams of the formation of the extension area of the UBM in process according the invention.
Figure 6B:
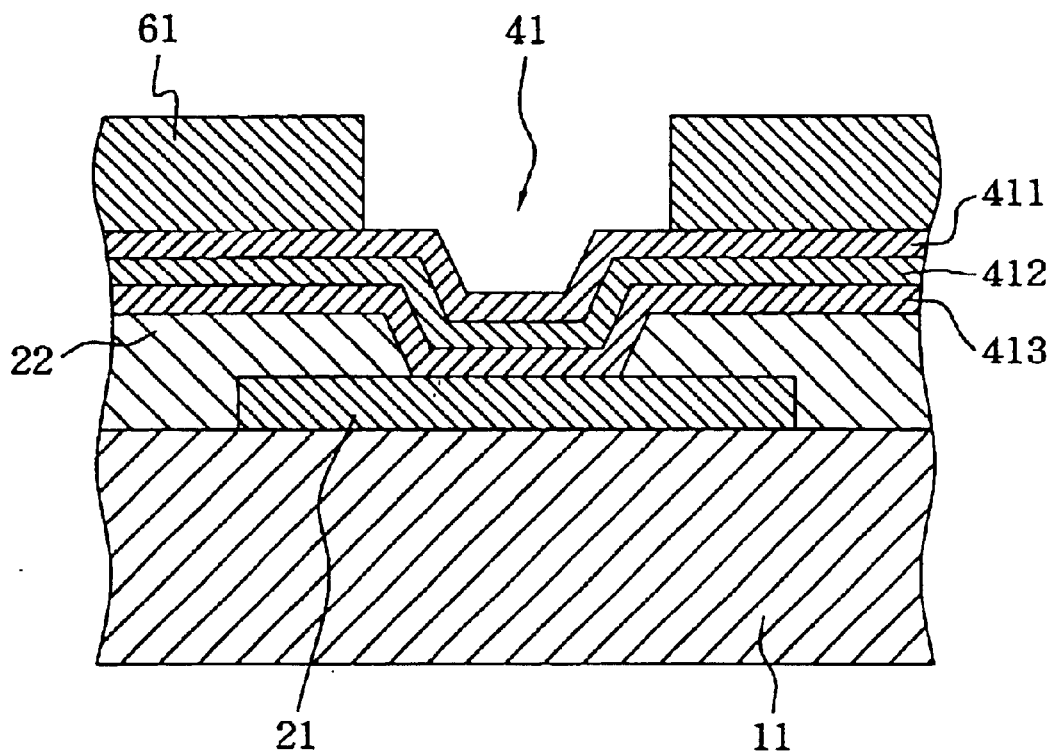
Figure 6C:
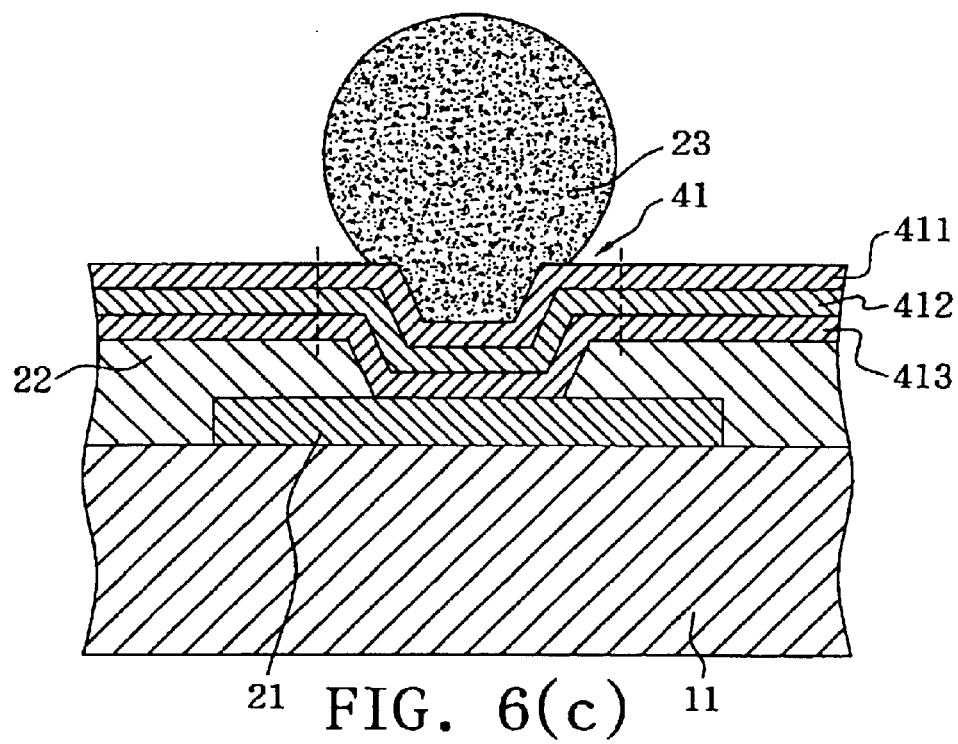
Figure 6D:
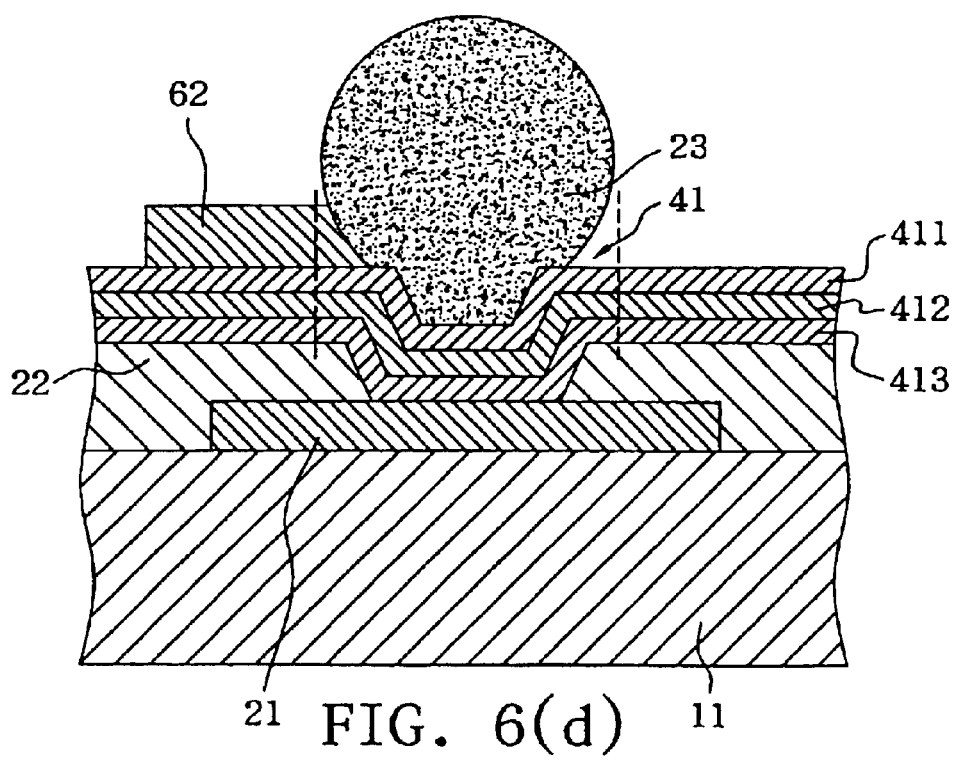
Figure 6E:
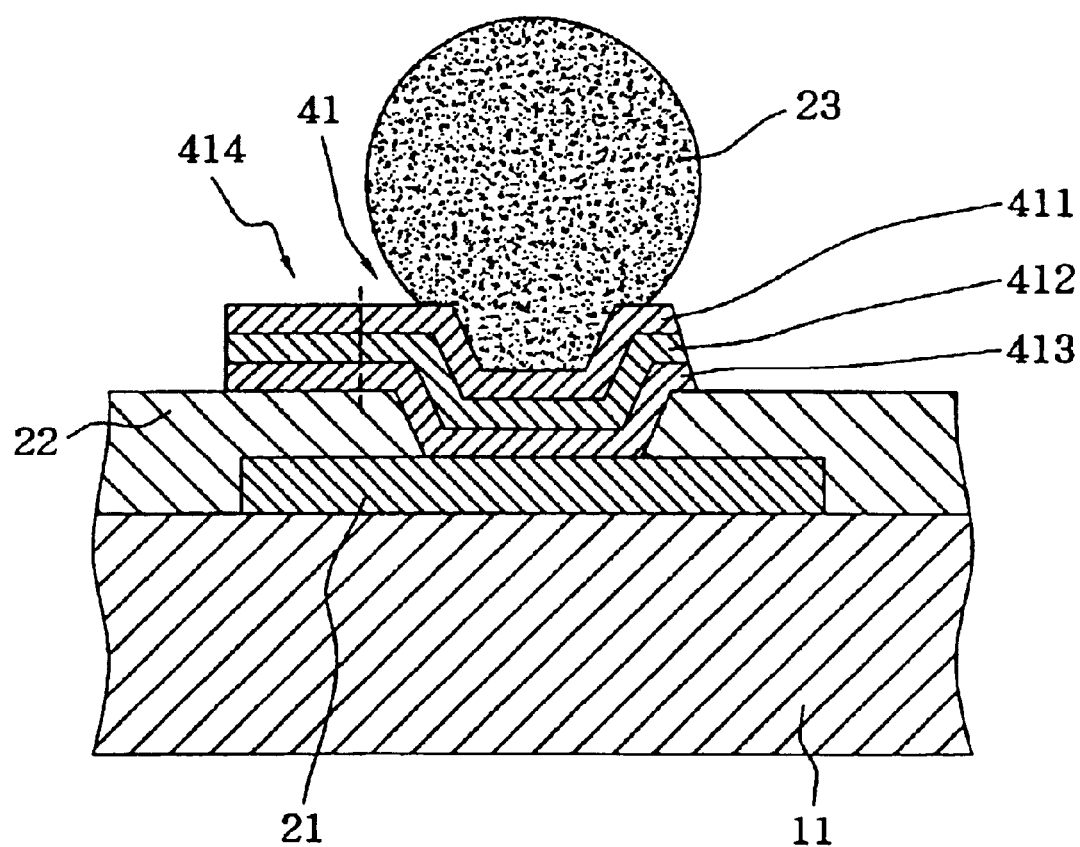

FIGS. 6(a) to 6(e) illustrate the structural schematic diagram of the formation of the extension area of the UBM in process according the invention. In FIG. 6(a), the three metal layers are deposited on the whole surface of the bonding pad 21 and on the partial protection layer 22 of the chip 11 by sputtering or vapor deposition to form an adhesion layer 413, a barrier layer 412 and a wetting layer 411. In FIG. 6(b), photoresist 61 covers the whole surface of wafer 11, including the predetermined location of the UBM 41 on the bonding pad 21, and the area of the photoresist 61 above the predetermined location can be removed through the steps of exposure and development. In FIG. 6(c), utilization of electroplating to bump the bump 23 (such as Sn-Pb alloy) onto the central cavity of the UBM 41, and then remove the photoresist 61 to make the bump 23 stand on top of the wetting layer 411. In FIG. 6(d), one side edge of the UBM 41 is covered with the residual photoresist 62 through steps of further exposure and development, to select proper etchant to etch out the excess metal layer and completely leave the bump 23, the UBM 41 and the extension area 414, as shown in FIG. 6(e).

There are various ways and steps to form the bump 23 and the UBM 41; the componental materials of bump are also numerous, such as the Sn—Pb alloy, Cu, Al and Au, etc. And, the way to form the bump 23 on top of the UBM 41 is not limited to one method of electroplating. The invention has only listed one preferred embodiment process, without specific limitation.

The above-described embodiments of the present invention are intended to give illustrations only. Numerous alternative embodiments may be devised by persons skilled in the art without departing from the scope of the following claims.

What is claimed is:

1. A device for testing electrical characteristics of a chip comprising:
   a plurality of bonding pads disposed on an active surface of said chip;
   a plurality of under bump metallurgies disposed on the bonding pads, at least one of said under bump metallurgies comprising at least an adhesion layer, a barrier layer and a wetting layer, wherein only said adhesion layer is provided with an extension area for measuring electrical characteristics of said chip; and
   a plurality of bumps separately formed on each of said under bump metallurgies.

2. The device of claim 1, wherein the plurality of bonding pads are selected from the group consisting of Al and Cu.

3. The device of claim 1, wherein said adhesion layer, said barrier layer and said wetting layer are formed of Al, Ni—V and Cu, respectively.

4. The device of claim 1, wherein said adhesion layer, said barrier layer and said wetting layer are formed of Ti, Ni—V and Cu, respectively.

5. The device of claim 1, wherein said adhesion layer, said barrier layer and said wetting layer are formed of Ni, Ni—V and Cu, respectively.

6. The device of claim 1, wherein said adhesion layer, said barrier layer and said wetting layer are provided with an extension area.

7. The device of claim 1, further comprising a protection layer formed on said active surface for exposing the plurality of bonding pads.

8. A device for testing electrical characteristics of a chip, comprising:
   a plurality of bonding pads disposed on an active surface of said chip;
   a plurality of under bump metallurgies disposed on the bonding pads, at least one of said under bump metallurgies provided with an extension area for measuring electrical characteristics of said chip, wherein said under bump metallurgies has a side wall covered by the lower portion of said bump; and
   a plurality of bumps separately formed on each of said under bump metallurgies.

9. The device of claims 8, wherein the plurality of bonding pads are selected from the group consisting of Al and Cu.

10. The device of claim 8, wherein said adhesion layer, said barrier layer and said wetting layer are formed of Al, Ni—V and Cu, respectively.

11. The device of claim 8, wherein said adhesion layer, said barrier layer and said wetting layer are formed of Ti, Ni—V and Cu, respectively.

12. The device of claim 8, wherein said adhesion layer, said barrier layer and said wetting layer are formed of Ni, Ni—V and Cu, respectively.

13. The device of claim 8, wherein said adhesion layer, said barrier layer and said wetting layer are provided with an extension area.

14. The device of claim 8, further comprising a protection layer formed on said active surface for exposing the plurality of bonding pads.

15. A device for testing electrical characteristics of a chip, comprising:

a plurality of bonding pads disposed on an active surface of said chip;

a plurality of under bump metallurgies disposed on the bonding pads, at least one of said under bump metallurgies comprising at least an adhesion layer, a barrier layer and a wetting layer, wherein said adhesion layer and said barrier layer are provided with an extension area for measuring electrical characteristics of said chip; and a plurality of bumps separately formed on each of said under bump metallurgies.

16. The device of claim 15, wherein the plurality of bonding pads are selected from the group consisting of Al and Cu.

* * * * *